(12) United States Patent
Fritzel (10) Patent No.: US 6,750,822 B2
(45) Date of Patent: Jun. 15, 2004

(54) MOBILE SYSTEM AND METHOD FOR CHARACTERIZING RADIATION FIELDS OUTDOORS IN AN EXTENSIVE AND PRECISE MANNER

(75) Inventor: Torsten Fritzel, Friedrichshafen (DE)

(73) Assignee: Astrium GmbH, Munich (DE)

( * ) Notice: Subject to any disclaimer, the term of this patent is extended or adjusted under 35 U.S.C. 154(b) by 0 days.

(21) Appl. No.: 10/169,373

(22) PCT Filed: Dec. 29, 2000

(86) PCT No.: PCT/DE00/04681

§ 371 (c)(1),
(2), (4) Date: Nov. 4, 2002

(87) PCT Pub. No.: WO01/50145

PCT Pub. Date: Jul. 12, 2001

(65) Prior Publication Data

US 2003/0122078 A1 Jul. 3, 2003

(30) Foreign Application Priority Data

Dec. 30, 1999 (DE) .......... 199 63 794
Sep. 4, 2000 (DE) .......... 100 43 461

(51) Int. Cl.$^7$ .......... G01R 29/10
(52) U.S. Cl. .......... 343/703
(58) Field of Search .......... 343/703; 250/336.1, 250/395; 356/3; 342/146

(56) References Cited

U.S. PATENT DOCUMENTS 4,422,076 A * 12/1983 Tricoles et al. .......... 342/458

FOREIGN PATENT DOCUMENTS

| DE | 26 00 140 C1 | 1/1976 | .......... G05D/1/04 |
| DE | 44 21 783 A1 | 6/1994 | .......... G01C/1/02 |
| DE | 195 43 321 A1 | 11/1995 | .......... H04B/7/26 |
| DE | 197 14 539 A1 | 4/1997 | .......... F42B/15/00 |
| GB | 1 303 621 | 7/1963 | .......... H04B/7/00 |

OTHER PUBLICATIONS

Henss: "hubschrauber–messung" N.T.Z. Nachrichtentechnische Zeitschrift, Bd. 40, No. 4, Apr. 1987 pp. 258–261, XP002168218.

Stehle et al: "reledop: a full–scale antenna pattern measurement", IEEE Trans on Broadcasting, Bd. 34, No. 2, Jun. 1998, pp. 210–220, XP000054225.

"Measuring helicopter–antenna", NTIS, Bd. 73d092, May 1987, p. 0423, XP002168220.

"Application of a Near–Field Measurement . . . " Eiji Hanayama et al, Electronics and Communications in Japan, Part 1, vol. 79, No. 10, 1996 pp. 79–90.

\* cited by examiner

Primary Examiner—Hoang V. Nguyen
(74) Attorney, Agent, or Firm—Crowell & Moring LLP (57) ABSTRACT

A mobile measuring arrangement for precise characterization of large area radiation fields includes a hovering and remotely controllable platform which includes a measuring probe and at least one attitude and position determining arrangement.

29 Claims, 6 Drawing Sheets

MOBILE SYSTEM AND METHOD FOR CHARACTERIZING RADIATION FIELDS OUTDOORS IN AN EXTENSIVE AND PRECISE MANNER

The present invention relates to an method and apparatus for the highly accurate characterization of radiation fields.

The evaluation of radiation fields is indispensable in many areas, as, for example, in antenna near-field measuring technology. In near-field measuring, which is preferably used for antennas in the frequency range from approximately 0.5 to 20 GHz, the immediate electromagnetic near field of an antenna is measured and is converted by means of a near-field (NF) to far-field (FF) transformation into the far field by means of the Fast Fourier Transformation (FFT). The advantage of measuring the near field of an antenna lies in the compact dimensions of the necessary antenna measuring systems, which heretofore have almost exclusively been integrated into stationary measuring chambers.

In contrast to near-field measuring systems, there are also far-field measuring systems. However, due to their dimensions, these are exterior systems, and are always stationary devices. also, they are considerably more prone to error as a result of reflections from the environment, terrain formations, buildings, etc.

Another advantage of the near-field measuring technique is that, as a result of a near-field recording, all far-field sections can be computed, while the once measured far-field sections are fixed and the antenna has to be measured again for additional far-field sections at a later point in time.

In accordance with the scanning theorem, the near field is scanned in $<\lambda/2$ intervals, and the entirety of the electromagnetic radiation emitted by the antenna must be detected, down to approximately −45 db, because the totality of these measuring points has an influence on each individual computed far-field point.

For measuring the radiation fields of omnidirectional antennas, spherical scanners are usually used, which scan the near field of the antenna to be measured on a spherical surface. In the case of directional antennas, the high-expenditure spherical scanners may be eliminated, as long as all radiation fractions down to approximately −45 db can be detected on a cylinder surface or on a planar surface. Since directional antennas (parabolic antennas) are mainly used, for example, in telecommunications, the selection in this field usually leads to cylindrical near-field measuring systems or planar systems.

In the NF to FF transformation, in addition to the amplitude values of the individual measuring points, phase information is also used. Therefore, a scanner, , should be able to scan a spherical surface, a cylinder or a planar surface by means of a measuring probe as nearly ideally as possible, because the NF to FF transformation is mathematically based on this ideal case. Error contributions by the scanner of a near-field measuring system should not exceed a deviation of $\lambda/50$ from the ideal contour.

Thus a scanner accuracy of 3.0 mm, at f=2.0 GHx and a phase accuracy of $\lambda/50$ are necessary. If ground station antennas with an antenna diameter of, for example, 14 mm are to be measured by means of a planar measuring system, this degree of accuracy must be achieved on a surface of at least 20 m×20 m.

For use with radar systems, near-field scanners should be as invisible as possible. This is of course contrary to the normal mechanical structures required for such scanners, and as a rule can be achieved only by the use of corresponding absorber coverings.

In order to obtain a maximum of phase accuracy of the measurement, data recording should be recorded for of all measuring points as rapidly as possible in order to minimize temporal phase drifts as much as possible.

Based on the above-mentioned example, with a surface to be scanned of 20 m×20 m and a measuring point distance of 75 mm, an array of 267 measuring points in width and 267 measuring points in height of the antenna, results in a total of at least 71,289 measuring points. A rough estimate shows that it would require unacceptable expenditures to drive to each of the measuring points, so that measuring must take place during the drive while passing the measuring position. At a scanning speed of 100 mm/sec., data recording would therefore require approximately 15 hours.

From Stehle et al., "Reledop: A Full-Scale Antenna Pattern Measurement" L.E.E.E. Trans. On Broadcasting, Volume 34, No. 2, June 1988 (1988/06, Pages 210–220 YP 000054225 New York, US) and also Henβ, "Hubschrauber-Messung" NTZ Nachrichtentechnische Zeitschrift, Volum 40, No. 4, April 1987 (1987/04, Pages 258–261, YP-002168218) Berlin, Del.), it is known to arrange probes by means of a pilot-controlled helicopter with the interposition of a long trail rope or a telescopic rod in a field to be measured. The use of a real helicopter and the interposition of long trail ropes or telescopic rods, however, do no permit highly accurate measuring, and particularly no highly accurate positioning within the field to be measured.

It is an object of the present invention to provide an method and apparatus for a highly accurate evaluation of radiation fields, by means of which highly accurate and large-surface measurements of radiation fields can be carried out at relatively low expenditures, particularly in the exterior region.

This an other objects and advantages are achieved by the measuring arrangement (particularly a mobile measuring arrangement) for the alignment/position and/or detection of electromagnetic characteristics of devices for/with the] emission of radiation fields according to the invention, which includes a remotely-controllable measuring device that can hover, and has a measuring probe for detecting the targeted signal, as well as at least one device for determining the attitude and position of the measuring device.

For determination of the attitude and position, position determination systems are preferably arranged in the vicinity of the emission device, in the form of position receivers/antennas that are provided in a defined position relative to the hovering device.

In the measuring device according to the present invention, preferably a highly accurate global, non-terrestrial position determination system (such as the GPS) is used as the position determination system.

Furthermore, it is preferred that the position receiver/antenna of the system for measuring the site, the position and the attitude, is arranged on the measuring probe. In order that the electromagnetic measurement conform as accurately as possible to the position determination or alignment of the emitting device, the phase center of the measuring probe should be situated as close as possible to the position receiver/antenna.

Furthermore, the emission device is preferably an antenna and, more specifically, a parabolic antenna or an array antenna.

In addition, the measuring arrangement may be include a combination of the position receiver/antenna, a compass, a device for measuring inertia forces, and one or more rotation sensors for determining and controlling the attitude of the hovering device. To the extent that it may be necessary in a special application, other components can be added.

According to another feature of the measuring device has a plurality of spatially separated position receivers/antennas. This permits the use of a differential method for determining the position and attitude of the hovering device.

In a further embodiment of the measuring arrangement according to the invention, an additional position receiver/antenna is provided as a reference on the ground in the area of the emission device. This permits the use of a differential method for determining the position and attitude of the hovering device.

In a measuring arrangement constructed in this manner, direct visual contact is not required between a ground station (at which, for example, the measuring equipment for processing the data supplied by the measuring probe, as well as devices for controlling the hovering measuring device can be provided) and the receiver. This may be an advantage, particularly in the case of spherical scanning contours.

The position receivers/antennas and/or the measuring probe on the hovering device can advantageously be arranged in such a manner that angular adjustment, swivelling or stabilization of the measuring probe is possible (in order, for example, to ensure a correct alignment, independent of an inclined position of the hovering device such as a helicopter, even under the effect of wind.) In particular, stabilization for small position and angle deflections can be provided which, taking the relative position of the emission device. This stabilization and/or positioning can advantageously also interact with the measuring control circuit, so that a corresponding tracking can be displayed. As a result, a tolerances can be compensated, and therefore the individual measurements can be accelerated.

In another embodiment of the measuring arrangement according to the invention, devices may be provided on the measuring probe for detecting the signal, hovering in front of the emission device. The relative momentary measuring position of these devices is detectable by at least one geodetic instrument which is equipped with a device for emitting a defined optical signal, a device for receiving an optical signal, and a device for reflecting the defined optical signal of the geodetic instrument at the position to be measured. The reflecting device may be, for example, a spherical reflection surface, so that the reflection of the defined optical signal is reduced to a point for the viewer, and/or spherical reflection surfaces may be provided in a defined relative position with respect to the hovering device and/or the measuring probe.

The reflection surface may be part of a metal-coated sphere.

According to a further embodiment of the invention, the geodetic device for receiving an optical signal may be provided with a concave primary mirror, a convex secondary mirror and a detector device sensitive in two dimensions (such as a position diode) for generating a reading signal. As an alternative to the mirrors, other optical systems, such a reflectors/refractors can also be used.

According to yet another embodiment of the invention, the secondary mirror may be placed essentially in the focus of the primary mirror, with the detector device placed opposite the secondary mirror in the area of the primary mirror, preferably behind an opening in the primary mirror, through which the reflected optical signal passes which is focussed in the secondary mirror.

Likewise, two geodetic instruments are preferably assigned to each reflection device, so that a cross bearing is permitted.

The optical signal emitted by the geodetic instrument is preferably a laser beam, particularly a power-adjustable and/or modulable laser beam, and is provided with highly accurate angle-position encoders in the azimuth and in the elevation, for the dynamically accurate detection of the bearing angles with respect to the respective reflector. For example, when two laser beams are used, they can be modulated with a different frequency, permitting identification of the reflected signal. Also, in a particularly preferred embodiment, the power adjusting capability is provided as a function of the distance between the laser source reflector and the detector device. In this manner damage to the diode due to excessive laser irradiation can be avoided. It was found to be particularly advantageous to use a semiconductor laser as the laser beam, so that modulation can be represented as an alternative or in a supporting manner also by frequency filters.

In this case, this measuring arrangement is preferably constructed such that three of the above-mentioned arrangements are provided, with three reflection surfaces in a defined relative position on the hovering device.

The measuring arrangement itself can detect electromagnetic characteristics in a manner that is known per se. Normally a measuring probe is used for this purpose. Thus, a reciprocal relationship can be achieved between the electromagnetic measurement, the measuring site and/or the position of the radiating device. As a result of the highly accurate relative determination of the three parameters—position, field and generating of the field—, it is possible in a simple manner to carry out a plurality of highly accurate measurements, in which case the measuring probe can be operated, for example, by using the initially described near-field measuring technique.

Furthermore, one of the spherical reflection surfaces is preferably arranged on the measuring probe. In order to maximize the degree of conformity between the electromechanical measurement and the position determination or alignment of the radiating device, the phase center of the measuring probe should be situated as close as possible to the center point of the spherical reflection surface. Optimum precision is obtained when the center point of the sphere and the phase center coincide. In addition, the emission device preferably is an antenna and, more specifically, a parabolic antenna or an array antenna.

In addition to the above-mentioned characteristics, the measuring arrangement according to the invention may include an autofocussing device for imaging the reflected laser beam, which speeds detection of individual measuring points, and increases their precision. It should also be mentioned that also the relative position of the diode or the detector device can be evaluated in the display area in order to further increase the measuring accuracy.

The size and the mass of the hovering device is preferably small in relationship to that of the emission device that is to be positioned, because objects in an electromagnetic field to be measured may result in considerable measuring errors. In order to meet this requirement, it is advantageous to provide, for example, a miniature helicopter as a hovering device. However, other alternatives, such as controlled balloons, zeppelins, or similar devices, are also conceivable, which preferably are radio-controlled.

In addition to the measuring, the invention also provides a method for the highly accurate evaluation of radiation fields, particularly for mobile use and/or in the exterior region. The method advantages according to the invention comprises the following steps:

1. positioning a hovering remotely-controllable measuring device in the radiation field, with a measuring probe for the detection of the radiation field at least one device for determining the attitude and position of the measuring device;

2. determining the position and attitude of the measuring device; and
3. generating a measuring signal for characterizing the radiation field; and
4. transmitting of the measuring signal from the hovering part of the measuring arrangement to a ground-side measuring instrument system.

According to the invention, the method can be further developed such that the coordinates of the systems can be determined in three spacial dimensions, and from these coordinates, position and the actual attitude of all six degrees of freedom of the measuring device are dynamically determined (particularly in real time).

Furthermore, the actual position and attitude (all six degrees of freedom) of the measuring device can be compared with the defined desired position and attitude, and can be controlled in a closed-loop control circuit during the controlling, stabilization or positioning of the measuring probe.

Finally, a person skilled in the art will understand that, although the present application addresses a radiating device, the invention can also be used in a reversal/supplementation in the case of a receiving system or a field-alternating, particularly a reflecting device.

One decisive advantage of the measuring arrangement according to the invention is that its mobility permits a complete and highly accurate characterization of radiation characteristics of large, usually stationary antenna systems in the exterior region.

Additional advantages of the invention include:

a high positioning precision from approximately 2.0 mm to 50 m;

large positioning ranges of up to 100 m edge length of a cube;

high positioning speed <1.0 min over a positioning route of 10 m;

highly accurate detection of all 6 degrees of freedom of 0.5 mm and 1.0 angular minutes at a distance of 50 m;

mobility;

lower installation expenditures; and broad application spectrum (antenna measurements, radar backscattering measurements, electromagnetic compatibility measurements, environmental measurements, etc.)

Other objects, advantages and novel features of the present invention will become apparent from the following detailed description of the invention when considered in conjunction with the accompanying drawings.

DETAILED DESCRIPTION OF THE INVENTION

Figure 1:
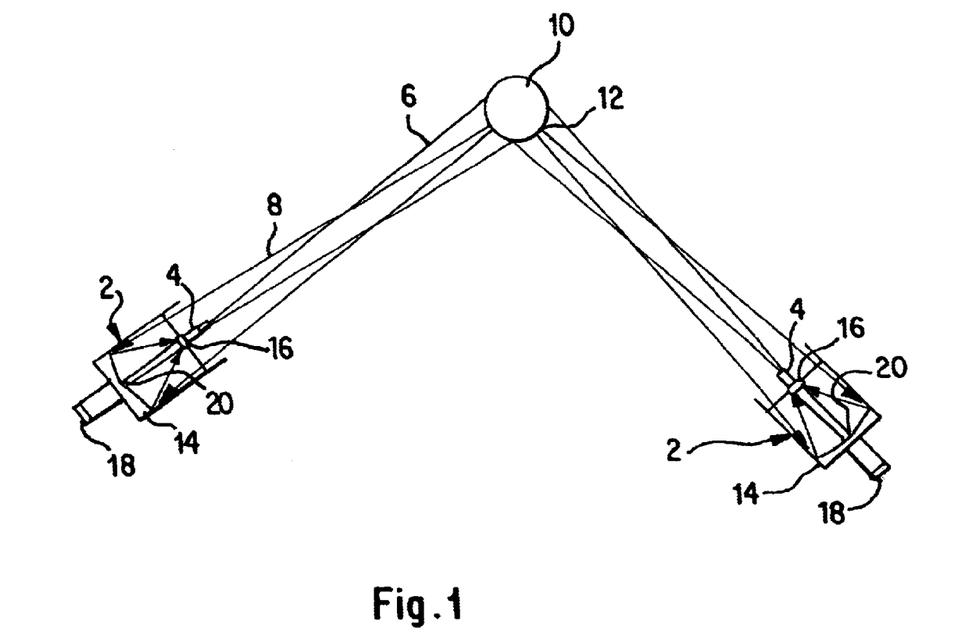
FIG. 1 is a schematic representation of an embodiment of a geodetic instrument for position measuring.

FIG. 1 illustrates an embodiment of an arrangement for the position measuring, having two geodetic instruments 2, (here optical theodolites), each having a device 4 for emitting a defined optical signal 6 (here a laser beam), as well as a device for receiving an optical signal 8, and a device 10 for the reflection of the defined optical signal 6 of the geodetic instrument 2 at the position to be measured. The device 10 is formed here by a reflecting or metal-coated sphere 10 so that the reflection of the defined optical signal 6 is reduced to a point 12 for the viewer.

As further illustrated in FIG. 1, for receiving the reflected optical signal 8 the geodetic device 2 is equipped with a concave primary mirror 14, a concave secondary mirror 16 and a detector device 18 that is sensitive in two dimensions, for generating a reading signal. The secondary mirror 16 is arranged in the focus of the primary mirror 14, and a detector device 18 is placed opposite the secondary mirror 16 in the area of the primary mirror 14 behind an opening 20 therein. The reflected optical signal 8 passes through the opening and is focussed in the secondary mirror 16. In the illustrated embodiment, each geodetic instrument 2 is equipped with highly accurate angle-position encoders and tracking drives in the azimuth and the elevation, for the dynamically accurate detection/tracking of the bearing angles to the respective reflector, by means of the detector device 18.

Figure 2:
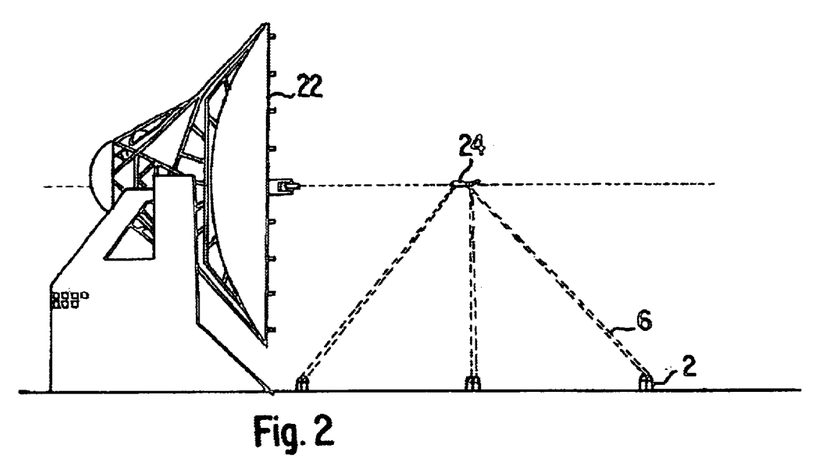
FIG. 2 is a schematic lateral view of an embodiment of the measuring arrangement for the positioning by means of geodetic instruments.

FIG. 2 shows an embodiment of a measuring arrangement for highly accurate alignment/positioning of a device for the emission of targeted radiation-type and/or wave-shaped signals, (here, a parabolic antenna 22). In the illustrated embodiment, a device 24 is provided which is equipped with a measuring probe for detecting the signal of the antennas 22, and hovers in front of the antenna. The position of this device 24 can be detected by a number of arrangements for the position measuring, such as illustrated in FIG. 1. FIG. 2 shows six optical theodolites 2, the laser beams 6 originating from the latter being aimed at reflectors fastened to the device 24 hovering in front of the antenna 22.

Figure 3:
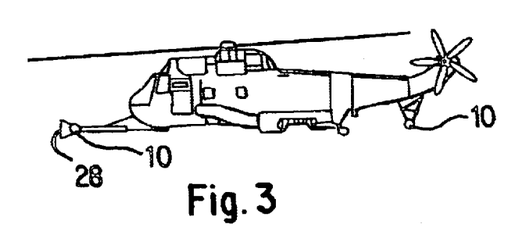
FIGS. 3 to 5 are views of an embodiment of the hovering device according to the invention.
Figure 4:
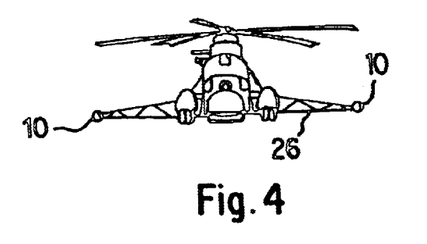
Figure 5:
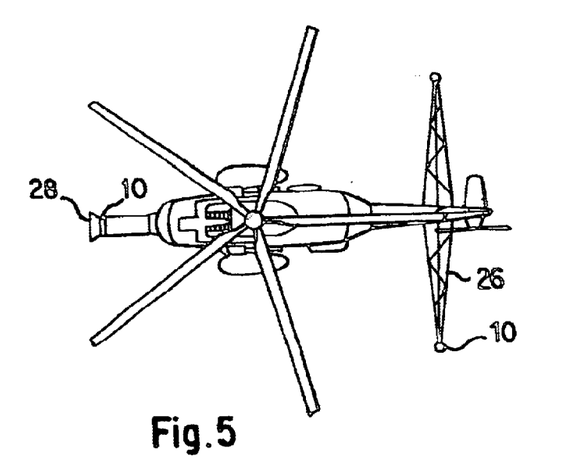

FIGS. 3 to 5 are more detailed views of the hovering device 24 of the embodiment according to FIG. 2. Here it is illustrated that a preferably miniaturized helicopter is used which is provided with three devices 10 for the determination of the attitude and position of the measuring device 24. These devices 10, which can be detected by systems for determining the attitude and position, are fastened to extension arms 26, or to the measuring probe 28 for the detection of the antenna signal, in a defined position relative to the helicopter. They may, for example, be metal-coated spheres 10, as described with reference to FIG. 1, or position receivers/antennas 10 for position determination systems (not shown) available at the site of the emission device 22.

The miniature helicopter is used in the illustrated embodiment because it is suitable for taking up a stable hovering position in front of the antenna 22 to be measured. It also has a small mass in comparison to the latter, so that virtually no measuring errors are generated as a result of the helicopter, and can be controlled by means of simple known technology. In order to further reduce measuring errors, a positioning and/or stabilizing device, (not shown) can be provided which represents a certain uncoupling with respect to the helicopter and permits an almost arbitrary position of the latter with respect to the radiating device. When the helicopter is, for example, above the radiating device, the measuring probe should be essentially directed downward.

Figure 6:
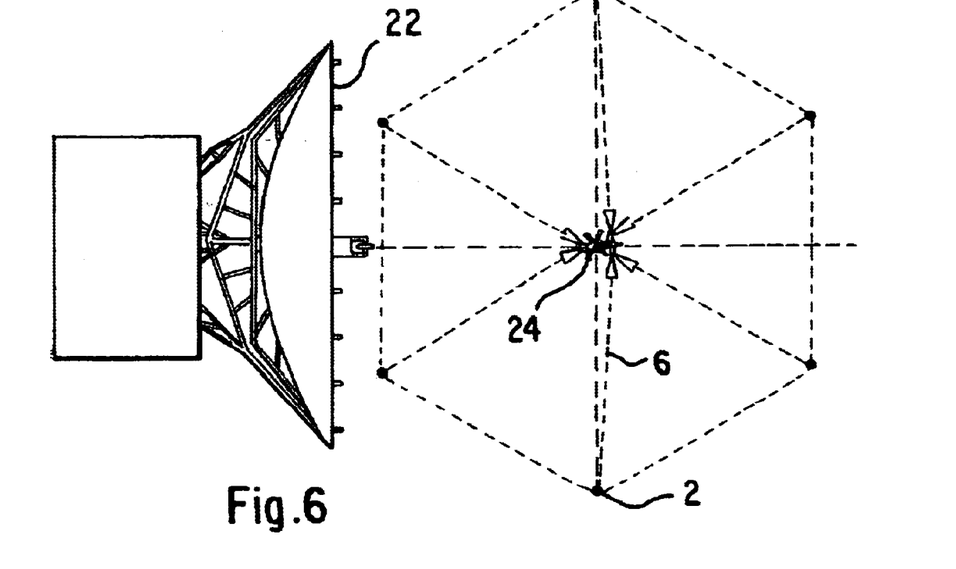
FIG. 6 is a top view of the measuring arrangement according to FIG. 2.
Figure 7:
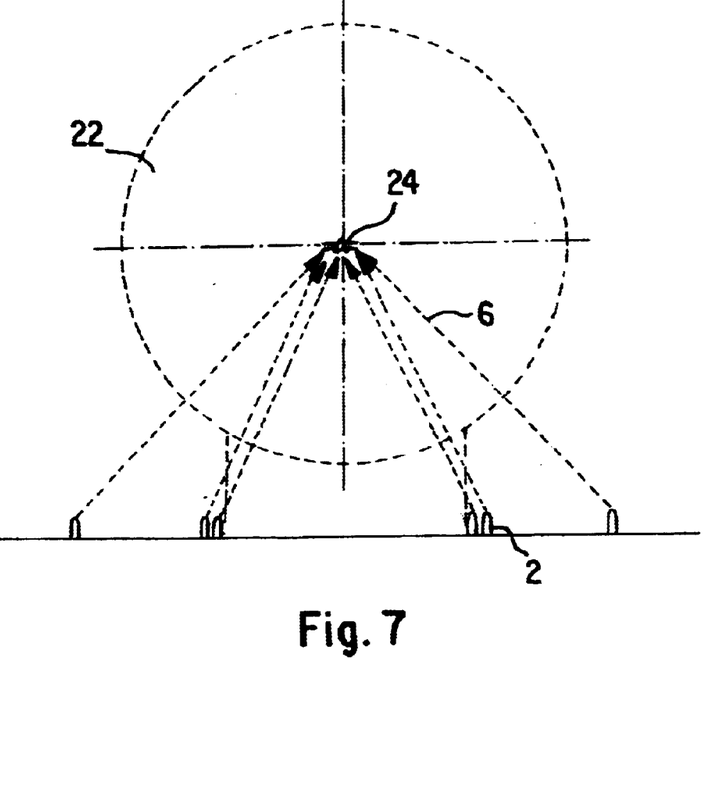
FIG. 7 is a frontal view of the measuring arrangement according to FIG. 2.

FIGS. 6 and 7 are a top view and a frontal view respectively of the embodiment of FIG. 2, identical elements having the same reference numbers.

In measuring arrangement according to FIGS. 2 to 7 the positions (azimuth and elevation) of the laser reflectors 10, which are fastened to the helicopter, are each determined by means of two of the highly accurate angle measuring devices 2. In this case, an automatic target tracking takes place based on the laser beam 6 emitted by the respective angle measuring device or optical theodolite 2, for example, by means of a tracking device.

When several laser beams are used, it should be possible to distinguish them from one another. For this purpose, modulable semiconductor lasers or lasers with frequency filters connected on the output side can, for example, be used, so that each laser beam has separate specific characteristics which permit its identification.

Each laser beam 6 is reflected at one of the laser reflectors 10 mounted on the helicopter, and is imaged by the optical telescope 14, 16 in the respective angle measuring device 2, on the detector device 18 which is sensitive in two dimensions. Any movement of the helicopter (and thus of the laser reflectors 10), causes a course indicating signal to be generated, which is fed into a regulating circuit. The latter causes a tracking by means of tracking drives (not shown), with regard to both azimuth and elevation. Highly accurate azimuth and elevation angle-position encoders and in the (not shown) supply dynamically precise bearing angles to the respective laser reflector 10. Since, as illustrated in FIGS. 2, 6 and 7, two angle measuring devices 2 respectively 2 take a bearing with respect to the same laser reflector 10, the coordinates of the respective laser reflector 10 can be determined in three spatial dimensions.

From the coordinates of the three laser reflectors 10, the actual position and attitude (six degrees of freedom) of the helicopter 24 will then be dynamically determined. This information is compared with a given desired position desired attitude, and the helicopter is controlled in a closed-loop control circuit by means of the helicopter control. In this manner, the helicopter or the measuring probe 28 mounted thereto for detecting the targeted signal of the antenna 22 can be positioned with the highest precision in all 6 degrees of freedom at heights of up to 100 m. The downlink from the helicopter 24 as the hovering device takes place according to known transmission concepts; coupling by way of a glass fiber arrangement freed of expansion faults is preferred in addition to other possibilities. However, care should be taken that this results in no faults, such as a phase displacement.

Figure 8:
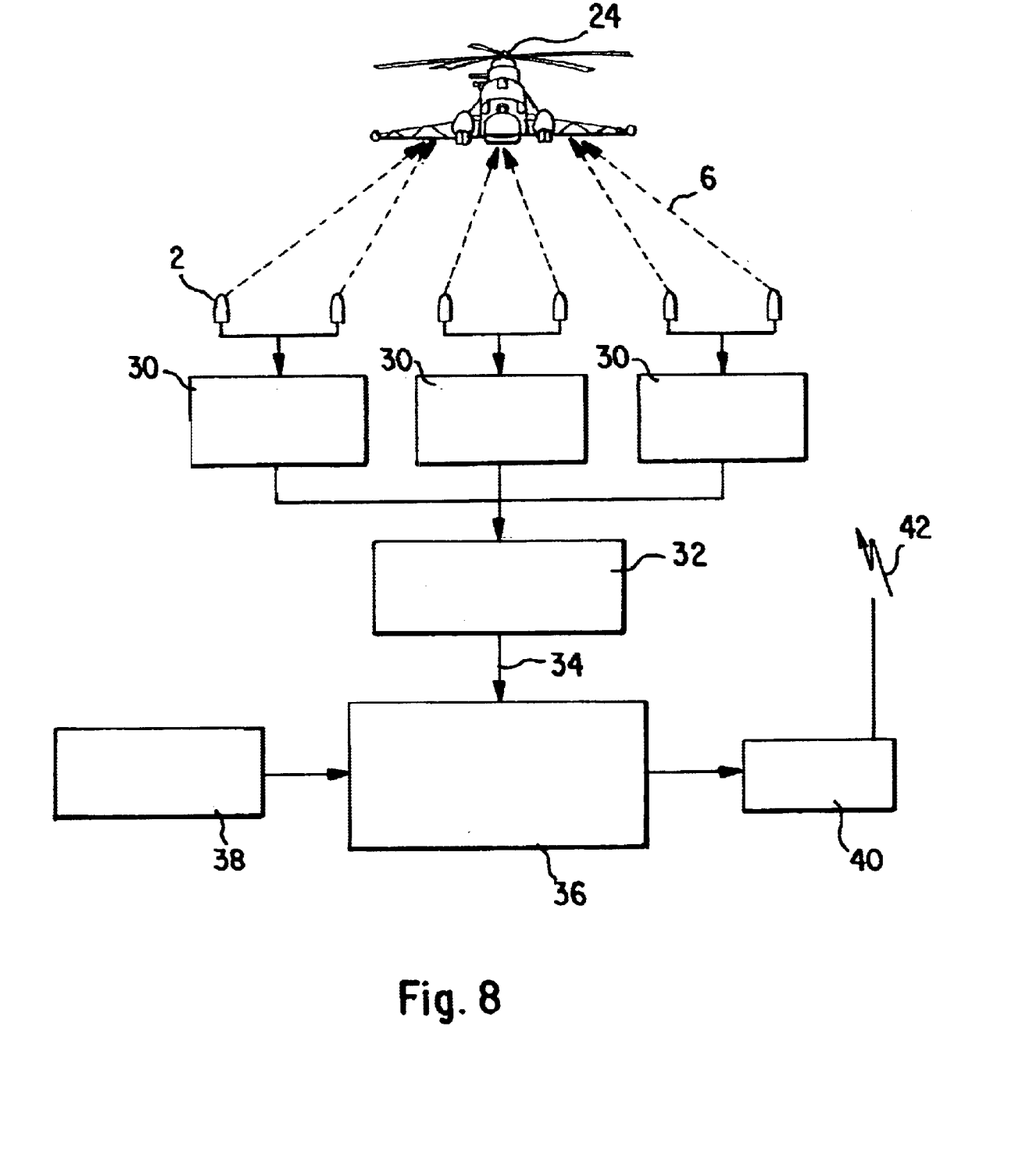
FIG. 8 is a schematic representation of the regulating and control concept according to the invention.

FIG. 8 illustrates the regulating and control concept of the present invention. The angle measuring devices 2 are connected with position computers 30 which compute the position of a respective reflector 10 in real time. The position data determined in this manner are transmitted to the position and attitude computer 32 of the hovering device 24. The actual values for the position and the attitude are fed into point 34, whereupon, at reference number 36, a desired/actual comparison takes place with respect to the position and attitude, taking into account the desired values 38 for the position and attitude originating from the application. On the basis of this comparison, correcting variables for the helicopter control 40 are generated which are transmitted by way of a remote control 42 to the helicopter 24.

Figure 9:
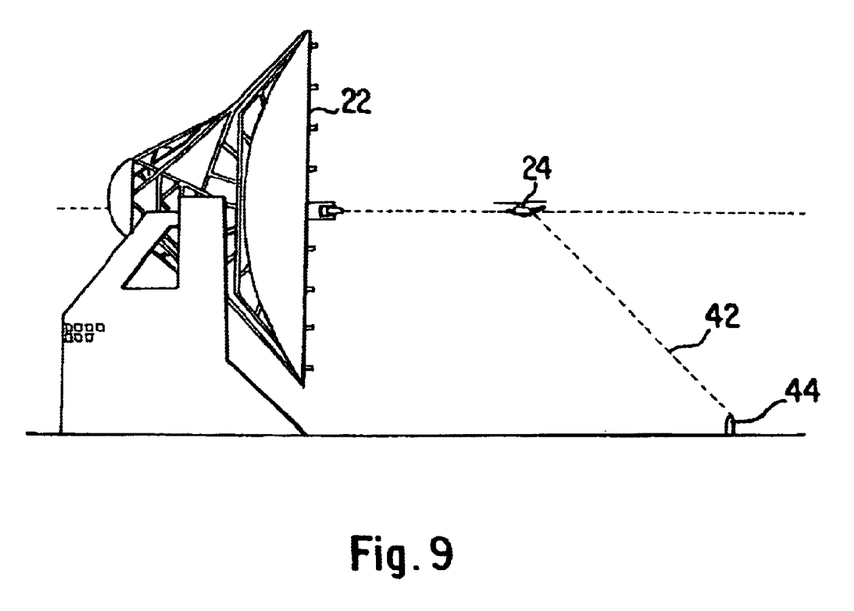
FIG. 9 is a schematic lateral view of an embodiment of the measuring arrangement for the positioning by means of position determination systems.

FIG. 9 shows another embodiment of a measuring arrangement according to the invention. (The same elements as in FIGS. 1 to 8 have the same reference numbers.) In this embodiment, a remotely-controllable hoverable measuring device 24 is equipped with a measuring probe 28 for detecting the targeted signal, and with at least one position receiver/antenna 10 for position determination systems (not shown) available at the site of the emission device (antenna 22). A global non-terrestrial site determination system, such as the GPS, is preferably used as the position determination system, by means of which positions above the earth surface can be determined with a relatively high accuracy. Another stationary position receiver/antenna 44 is provided at a ground station. The measuring device 24 is connected by way of a data link 42 with a ground station or the position receiver/antenna 44 provided there, which supplies a highly accurate reference position.

By means of the measuring arrangement according to the invention, a reciprocal relationship can be achieved between the electromagnetic measurement, the measuring site and/or the position of the radiating device 22. As a result of the highly accurate relative determination of the three parameters—position, field and generating of fields—, it is possible in a simple manner to implement a plurality of highly accurate measurements. The measuring probe 28 can thus be operated, for example, by using the near-field measuring technique.

It should be noted in this case that here the preferably miniaturized helicopter, as described with reference to FIGS. 3 to 5, is equipped with three position receivers/antennas 10 for a navigation or positioning system, such as the GPS, which are fastened to the extension arms 26 or to the measuring probe 28 in a defined position to the helicopter and to one another respectively. In order to maximize the degree of conformity between the electromagnetic measurement and the position determination or alignment of the radiating device 22, the phase center of the measuring probe 28 is situated very close to the position receiver/antenna 10.

The provision of a plurality of spatially separated position receivers/antennas 10 on the miniature helicopter 24, as well as the additional position receiver/antenna as reference on the ground in the area of the emission device, permits the use of a different method for the position and attitude determination, such as the DGPS of the helicopter 24.

In the case of a measuring arrangement constructed according to the present invention, direct visual contact is not required between the ground station 44 (at which, for example, measuring equipment may be provided for the processing of the data supplied by the measuring probe as well as devices for controlling the hovering measuring device 24) and the respective receiver 10. This may be an advantage, particularly in the case of spherical scanning contours.

In order to further reduce measuring errors, a positioning and/or stabilizing device (not shown) can be provided which represents a certain uncoupling with respect to the helicopter and permits an almost arbitrary position of the latter with respect to the radiating device. When the helicopter is, for example, present above the radiating device, the measuring probe 28 should be essentially directed downward.

Figure 10:
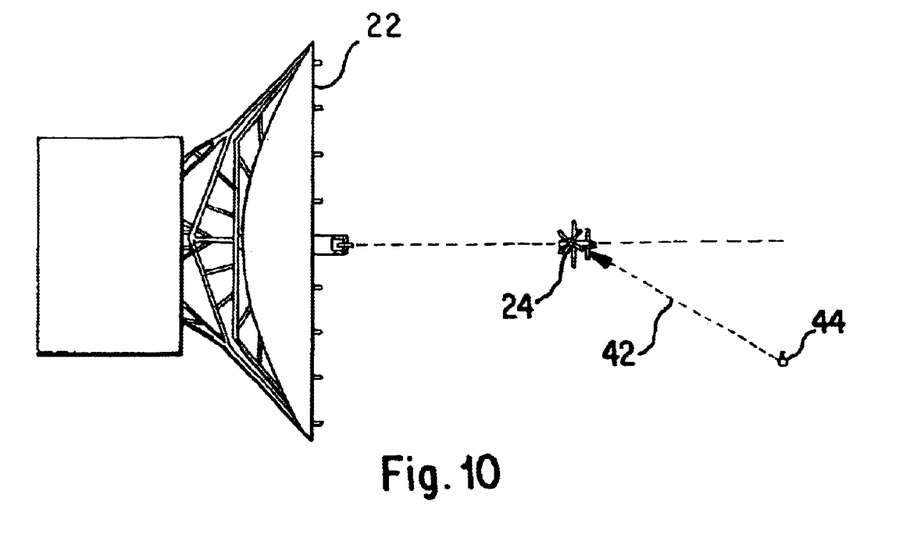
FIG. 10 is a top view of the measuring arrangement according to FIG. 9.
Figure 11:
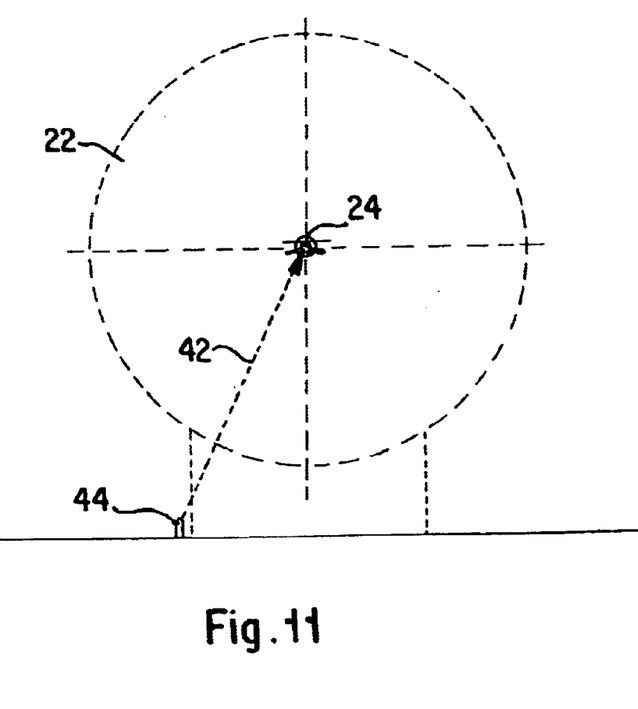
FIG. 11 is a frontal view of the measuring arrangement according to FIG. 9.

FIGS. 10 and 11 are a top view and a frontal view respectively of the arrangement of FIG. 9.

In measuring arrangement according to FIGS. 9 to 11 the positions of the position receiver/antenna 10, which are fastened to the helicopter 24, as well as of the position receiver/antenna 44 of the ground station 44, are determined in each case. From this information the respective momentary position and attitude of the helicopter 24 can be computed preferably in real time.

By the use of a corresponding navigation or positioning system, such as the GPS, the coordinates of the respective position receiver/antennas 10 can be determined. From the coordinates of the three position receivers/antennas 10 as well as the position receiver/antenna 44, the actual position and the actual attitude (all six degrees of freedom) of the helicopter 24 will then be dynamically determined. This information is compared with the defined desired position and desired attitude and is controlled in a closed-loop control circuit by means of the helicopter control. In this manner, the helicopter or the measuring probe 28 mounted thereon for detecting the targeted signal of the antenna 22 can be positioned with the greatest accuracy in all 6 degrees of freedom. The downlink 42 from the helicopter 24 as a hovering device takes place according to known concepts, in which case the transmission of the measuring signals for the characterization of the radiation field can be implemented, for example, by means of a glass fiber arrangement from which the expansion and temperature errors have been removed. Care should, however, be taken that no inadmissible errors, such has phase displacements, occur as a result.

The regulating and control concept of the present invention provides that position computers compute the respective position of a position receiver/antenna 10 as nearly as possible in real time. The position data determined in this manner are transmitted to a position computer of the helicopter 24. The actual values for the position and attitude are fed into the position computer of the helicopter 24, whereupon a desired/actual comparison takes place with respect to the position and attitude while the desired values for the position and attitude are taken into account which originate from the application. On the basis of this comparison, operating variables for the helicopter control are generated which are transmitted by remote control to the helicopter 24.

By means of the arrangement according to the present invention, high positioning accuracy can be achieved in a simple and advantageous manner. Also, high positioning speeds and a highly accurate detection of all 6 degrees of freedom and most importantly, a highly accurate characterization of radiation fields being permitted. In this case, the arrangement and the method are suitable for applications in the exterior region, ensure mobility, require low installation expenditures and have a broad application spectrum (antenna measurements, radar backscattering measurement, electromagnetic compatibility measurements, environmental measurements, etc.) However, due to their mobility, they mainly permit a highly accurate and large-surface measuring and characterization of radiation fields in the exterior region.

In addition to the illustrated embodiment, a combination of individual elements of the respective embodiments with one another is also conceivable.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A measuring arrangement for evaluating electromagnetic characteristics of an apparatus for emission or reflection of radiation fields, said measuring arrangement comprising:

a remotely controllable measuring device which can hover at a spatial position;

a measuring probe arranged on the measuring device, for detecting a targeted signal propagated from the apparatus;

at least one element arranged on the measuring device for determining attitude and position of the measuring device; and systems for determining the attitude and position of the measuring device; wherein the element for determining attitude and position can be detected by the systems for determining the attitude and position; and size and mass of the measuring device are small in relation to the apparatus to be evaluated.

2. A measuring arrangement according to claim 1, wherein:

the systems for determining the attitude and position are position are arranged at the site of the emission device; and the at least one element for determining attitude and position comprises at least one position receiver/antenna, disposed in a defined position relative to the measuring device.

3. The measuring arrangement according to claim 2, wherein a global non-terrestrial site determination system is used as the position determination system.

4. The measuring arrangement according claim 1, wherein the at least one element for determining attitude and position comprises a position receiver/antenna arranged on the measuring probe.

5. The measuring arrangement according to claim 4, wherein the position receiver/antenna is arranged in the direct proximity to the phase center of the measuring probe.

6. The measuring arrangement according to claim 4, wherein:

the measuring device further comprises a compass, a device for measuring inertial forces and/or accelerations, and at least one rotation sensor, for determination and control of the attitude of the hovering measuring device.

7. The measuring arrangement according claim 4, wherein the measuring device has a plurality of position receivers/antennas arranged thereon, at spatially separated positions.

8. The measuring arrangement according to claim 4, wherein an additional position receiver/antenna is provided as a reference on the ground in the area of the emission device.

9. The measuring arrangement according to claim 1, wherein:

the systems for determining attitude and position comprise at least one geodetic instrument, which is equipped with a device for emitting a defined optical signal and a device for receiving an optical signal, including at least one spherical reflection surface for reflection of the defined optical signal of the geodetic instrument at a position to be measured, so that the reflection of the defined optical signal is reduced to a point for a viewer; and the spherical reflection surface is provided in a defined position relative to the measuring device.

10. The measuring arrangement according to claim 9, wherein the reflection surface comprises at least a part of a metal-coated sphere.

11. The measuring arrangement according to claim 9, wherein the device for receiving an optical signal includes a concave primary mirror, a convex secondary mirror and a detector device that is sensitive in two dimensions for generating a reading signal.

12. Measuring arrangement according claim 11, wherein:
the secondary mirror is placed approximately at a focus of the primary mirror; and
the detector device is placed opposite the secondary mirror, in proximity to the area of the primary mirror.

13. The measuring arrangement according to claim 12, wherein the detector device is placed behind an opening in the primary mirror.

14. The measuring arrangement according to claim 11, wherein the reflection surface comprises at least a part of a metal-coated sphere.

15. The measuring arrangement according to claim 9, wherein two geodetic instruments are assigned to each reflection device, whereby a cross bearing is permitted.

16. The measuring arrangement according to claim 9, wherein the optical signal emitted by the geodetic instrument is a laser beam.

17. The measuring arrangement according to claim 16, wherein the laser beam is at lease one of power-adjustable and modulable.

18. The measuring arrangement according to claim 9, wherein the geodetic instrument has precision azimuth elevation angle-position encoders, for dynamically accurate detection of the bearing angles with respect to a respective reflection device.

19. The measuring arrangement according to claim 9, wherein three spherical reflection surfaces are provided for the reflection of the defined optical signal of the geodetic instrument at a position to be measured.

20. The measuring arrangement according to claim 9, wherein
one of the spherical reflection surfaces is arranged on the measuring probe; and
a phase center of the probe coincides substantially with a center point of the spherical reflection surface.

21. The measuring arrangement according to claim 1, wherein the measuring probe is constructed for near-field measuring.

22. The measuring arrangement according to claim 1, wherein, the measuring device is a remote-controllable miniature helicopter.

23. The measuring arrangement according to claim 1, wherein the measuring device is a remote-controlled balloon.

24. The measuring arrangement according to claim 1, wherein the measuring device is a remote-controlled zeppelin.

25. The measuring arrangement according to claim 1, wherein the measuring device is a remote-controlled airplane.

26. A method for the characterization of radiation fields, comprising:
hovering a remote-controllable measuring device in the radiation field, said measuring device having a measuring probe for detection of the radiation field, and at least one element for determining attitude and position of the measuring device, which element can be detected by systems for determining the attitude and position;
determining position and attitude of the measuring device, said measuring device generating a measuring signal for characterizing the radiation field; and
transmitting the measuring signal from the hovering measuring device to a ground-side measuring instrument system.

27. The method according to claim 26, wherein:
spatial coordinates of the at least one element for determining position and attitude are determined; and
based on said coordinates, actual position and attitude of the measuring device in six degrees of freedom is dynamically determined.

28. The method according to claim 27, wherein:
the actual position and attitude of the measuring device are compared with a defined desired position; and
attitude and position are controlled in a closed-loop control circuit by control of the measuring device.

29. The method according to claim 27, wherein actual position and attitude are determined in real time.

* * * * *